(12) United States Patent  
Ihn et al.

(10) Patent No.: US 9,472,693 B2  
(45) Date of Patent: Oct. 18, 2016

(54) SOLAR CELL AND METHOD FOR MANUFACTURING THE SAME

(71) Applicant: Samsung Electronics Co., Ltd., Suwon-Si, Gyeonggi-Do (KR)

(72) Inventors: Soo-Ghang Ihn, Hwaseong-si (KR); Kilwon Cho, Pohang-si (KR); Yeong Suk Choi, Suwon-si (KR); Sae Byeok Jo, Pohang-si (KR); Heung Gyu Kim, Pohang-si (KR); Myungsun Sim, Pohang-si (KR)

(73) Assignees: Samsung Electronics Co., Ltd., Gyeonggi-do (KR); Postech Academy-Industry Foundation, Gyeonsangbuk-do (KR)

( * ) Notice: Subject to any disclaimer, the term of this patent is extended or adjusted under 35 U.S.C. 154(b) by 590 days.

(21) Appl. No.: 13/777,621

(22) Filed: Feb. 26, 2013

(65) Prior Publication Data

US 2013/0327388 A1      Dec. 12, 2013

(30) Foreign Application Priority Data

Jun. 7, 2012 (KR) .................. 10-2012-0061092  
Nov. 7, 2012 (KR) .................. 10-2012-0125683

(51) Int. Cl.
*H01L 31/0216* (2014.01)  
*H01L 31/18* (2006.01)  
(Continued)

(52) U.S. Cl.
CPC ..... *H01L 31/02167* (2013.01); *H01L 51/4253* (2013.01); *H01L 51/4273* (2013.01); *C08G 2261/124* (2013.01); *C08G 2261/143* (2013.01); *C08G 2261/148* (2013.01); *C08G 2261/1412* (2013.01); *C08G 2261/1414* (2013.01); *C08G 2261/1424* (2013.01); *C08G 2261/3142* (2013.01); *C08G 2261/3223* (2013.01); *C08G 2261/3229* (2013.01); *C08G 2261/3243* (2013.01); *C08G 2261/344* (2013.01); *C08G 2261/91* (2013.01); *H01L 51/0036* (2013.01); *H01L 51/0043* (2013.01);
(Continued)

(58) Field of Classification Search
CPC .................... H01L 31/0216; H01L 31/02167  
USPC .................... 136/252, 256, 261, 265  
See application file for complete search history.

(56) References Cited

U.S. PATENT DOCUMENTS

2002/0106451 A1    8/2002   Skarp et al.  
2006/0070653 A1    4/2006   Elrod et al.  
(Continued)

FOREIGN PATENT DOCUMENTS

JP      2006165537 A      6/2006  
KR      1020110051821 A   5/2011

OTHER PUBLICATIONS

Srinivas Sista, Enhancement in Open Circuit Voltage Through a Cascade-Type Energy Band Structure, Applied Physics Letter, 91, 223508 (2007), American Institute of Physics, 10.1063/1.2817935.

(Continued)

*Primary Examiner* — Susan D Leong  
(74) *Attorney, Agent, or Firm* — Harness, Dickey & Pierce, P.L.C.

(57) ABSTRACT

A solar cell includes a first electrode, a second electrode facing the first electrode, a photoactive layer between the first electrode and the second electrode and including an electron donor and an electron acceptor, and a partially oxidized metal thin film between the first electrode and the photoactive layer.

16 Claims, 3 Drawing Sheets

(51) Int. Cl.
  *H01L 51/42* (2006.01)
  *H01L 51/44* (2006.01)
  *H01L 51/00* (2006.01)
(52) U.S. Cl.
  CPC ...... *H01L 51/445* (2013.01); *H01L 2251/308* (2013.01); *Y02E 10/549* (2013.01)

(56) References Cited

U.S. PATENT DOCUMENTS

2008/0149178 A1* 6/2008 Reyes-Reyes et al. ....... 136/263
2011/0108116 A1 5/2011 Kang et al.
2011/0297216 A1 12/2011 Ihn et al.

OTHER PUBLICATIONS

Irfan, Energy Level Evolution of Molybdenum Trioxide Interlayer Between Indium Tin Oxide and Organic Semiconductor, Applied Physics Letter, 96, 073304 (2010), American Institute of Physics, 10.1063/1.3309600.

Chao-Hsiang Hsieh, Highly Efficient and Stable Inverted Polymer Solar Cells Integrated With a Cross-Linked Fullerene Material as an Interlayer, American Chemical Society, 2010, pp. 4887-4893, 10.1021/ja100236b.

Lara-Jane Pegg, Enhancing the Open-Circuit Voltage of Molecular Photovoltaics Using Oxidized AU Nanocrystals, American Chemical Society, 2010, vol. 4, No. 10, pp. 5671-5678.

Shogo Kato, Efficient Organic Photovoltaic Cells Using Hole-Transporting MoO3 Buffer Layers Converted From Solution-Processed MoS2 Films, The Japan Society of Applied Physics 50, 2011, 10.1143/JJAP.50.071604.

Ji Hye Jeon, The Effect of a Concentration Graded Cathode for Organic Solar Cells, Solar Energy Materials & Solar Cells 95, 2011, 2443-2447.

* cited by examiner

SOLAR CELL AND METHOD FOR MANUFACTURING THE SAME

CROSS-REFERENCE TO RELATED APPLICATIONS

This application claims priority under 35 U.S.C. §119 to Korean Patent Application Nos. 10-2012-0061092 and 10-2012-0125683, filed in the Korean Intellectual Property Office on Jun. 7, 2012 and Nov. 7, 2012, the entire contents of which are incorporated herein by reference.

BACKGROUND

1. Field

Example embodiments relate to a solar cell and a method for manufacturing the same.

2. Description of the Related Art

A solar cell is a photoelectric conversion device that transforms solar energy into electrical energy, and has attracted much attention as an infinite but pollution-free next generation energy source.

A solar cell includes p-type and n-type semiconductors and produces electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors. Further, a solar cell is required to have as much efficiency as possible for producing electrical energy from solar energy.

SUMMARY

Example embodiments provide a solar cell having improved efficiency. Example embodiments also provide a method of manufacturing the solar cell. The solar cell may effectively absorb light with minimum or relatively little loss so that as many electron-hole pairs as possible may be produced, and then collect the produced charges without loss.

According to example embodiments, a solar cell may include a first electrode, a second electrode facing the first electrode, a photoactive layer between the first electrode and the second electrode, the photoactive layer including an electron donor and an electron acceptor, and a partially oxidized metal thin film between the first electrode and the photoactive layer.

The partially oxidized metal thin film may have a work function between that of a non-oxidized metal and that of a fully oxidized metal. The difference between a work function of the partially oxidized metal thin film and a work function of the first electrode may range from about 0.2 eV to about 0.95 eV, and the difference between a work function of the partially oxidized metal thin film and a highest occupied molecular orbital (HOMO) level of the electron donor may range from about 0.05 eV to about 1.0 eV.

The electron donor may have a HOMO level of about 5.4 eV to about 6.0 eV. The difference between a work function of the partially oxidized metal thin film and a work function of the first electrode may range from about 0.4 eV to about 0.8 eV, and the difference between a work function of the partially oxidized metal thin film and a HOMO level of the electron donor may range from about 0.1 eV to about 0.75 eV.

The electron donor may have a HOMO level of about 5.4 eV to about 6.0 eV. The partially oxidized metal of the partially oxidized metal thin film may have a work function of about 5.2 eV to about 5.8 eV. The partially oxidized metal of the partially oxidized metal thin film may have a work function of about 5.4 eV to about 5.6 eV.

The first electrode may be an anode, and the metal of the partially oxidized metal thin film may include one of nickel (Ni), ruthenium (Ru), tungsten (W), molybdenum (Mo), vanadium (V), iridium (Ir), niobium (Nb), tantalum (Ta), Rhodium (Rh) and a combination thereof.

The first electrode may be a cathode, and the metal of the partially oxidized metal thin film may include one of titanium (Ti), zinc (Zn), silicon (Si) and a combination thereof. The partially oxidized metal thin film may have a thickness of less than or equal to about 10 nm.

According to example embodiments, a method of manufacturing a solar cell may include forming a metal thin film on a first electrode, partially oxidizing the metal thin film to form a partially oxidized metal thin film, forming a photoactive layer on the partially oxidized thin film, the photoactive layer including an electron donor and an electron acceptor, and forming a second electrode on the photoactive layer.

Partially oxidizing the metal thin film may anneal the metal thin film at a temperature of about 200° C. to about 600° C. while supplying an oxygen-containing gas. Partially oxidizing the metal thin film may anneal the metal thin film by providing at least one of oxygen gas ($O_2$) and ozone gas ($O_3$) at a flow rate of about 10 sccm to about 200 sccm for about 1 minute to about 30 minutes.

Partially oxidizing the metal thin film may form the partially oxidized metal thin film having a work function between that of a non-oxidized metal and that of a fully oxidized metal.

The first electrode may be formed to have a first work function, the partially oxidized metal thin film may be formed to have a second work function, and the electron donor of the photoactive layer may be formed with a highest occupied molecular orbital (HOMO) level having a third work function, the difference between the first work function and the second work function may range from about 0.2 eV to about 0.95 eV, and the difference between the second work function and the third work function may range from about 0.05 eV to about 1.0 eV.

The partially oxidized metal thin film may have a work function of about 5.2 eV to about 5.8 eV. The HOMO level of the electron donor may have a work function of about 5.4 eV to about 6.0 eV.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
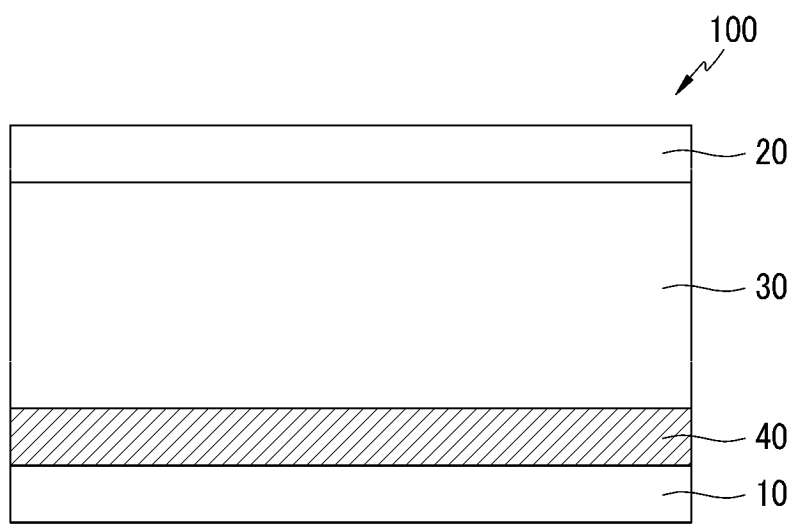
FIG. 1 is a cross-sectional view of a solar cell according to example embodiments.

Example embodiments will hereinafter be described in detail referring to the following accompanied drawings, and can be more easily performed by those who have common knowledge in the related art. However, these embodiments are only examples, and the inventive concepts are not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Referring to the drawings, a solar cell according to example embodiments is illustrated. FIG. 1 is a cross-sectional view of a solar cell according to example embodiments. Referring to FIG. 1, the solar cell 100 includes a substrate (not shown), a first electrode 10, a second electrode 20 facing the first electrode 10, a photoactive layer 30 interposed between the first electrode 10 and second electrode 20, and a partially oxidized metal thin film 40 interposed between the first electrode 10 and photoactive layer 30.

The substrate may be positioned at the first electrode 10 or the second electrode 20, and may be made of a transparent material. The transparent material may include, for example an inorganic material, e.g., glass, or an organic material, e.g., polycarbonate, polymethylmethacrylate, polyethylene terephthalate, polyethylene naphthalate, polyamide, polyethersulfone, or a combination thereof.

One of the first electrode 10 and the second electrode 20 is an anode and the other is a cathode. One of the first electrode 10 and second electrode 20 may be made of a transparent conductor, e.g., indium tin oxide (ITO), indium doped zinc oxide (IZO), tin oxide ($SnO_2$), aluminum doped zinc oxide (AZO), and/or gallium doped zinc oxide (GZO), and the other may be made of an opaque conductor, e.g., aluminum (Al), silver (Ag), gold (Au), and/or lithium (Li).

The photoactive layer 30 may be made of a photoactive material including an electron acceptor made of an n-type semiconductor material, and an electron donor made of a p-type semiconductor material.

The electron acceptor and electron donor may form, for example, a bulk heterojunction structure. In the case of forming the bulk heterojunction, when the electron-hole pair excited by light absorbed in the photoactive layer 30 reaches the interface of the electron acceptor and electron donor by diffusion, electrons and holes are separated by the electron affinity difference of the two materials for the interface, electrons are moved to the cathode through the electron acceptor and holes are moved to the anode through the electron donor, so as to generate a photocurrent.

The photoactive material may include, for example, at least two selected from polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylene]vinylene); MDMO-PPV (poly(2-methoxy-5-(3,7-dimethyloctyloxy)-1,4-phenylene-vinylene)); pentacene; perylene; PEDOT (poly(3,4-ethylene dioxythiophene)); poly(3-alkylthiophene); PTB1 (poly((4,8-bis(octyloxy)benzo[1,2-b:4,5-b']dithiophene)-2,6-diyl-alt-(2-((dodecyloxy)carbonyl)thieno[3,4-b]thiophene)-3,6-diyl)); PTB7 (poly((4,8-bis(2-ethylhexyloxy)benzo[1,2-b:4,5-b']dithiophene)-2,6-diyl-alt-(2-((2-ethyl hexyloxy) carbonyl)-3-fluorothieno[3,4-b]thiophene)-3,6-diyl)); phthalocyanine; SnPc (tin(II) phthalocyanine); copper phthalocyanine; triarylamine; benzidine; pyrazoline; styrylamine; hydrazone; carbazole; thiophene; 3,4-ethylene dioxythiophene (EDOT); pyrrole; phenanthrene; tetracene; naphthalene; rubrene; NTCDA (1,4,5,8-naphthalene-tetracarboxylic dianhydride); $Alq_3$; fullerene ($C_{60}$, $C_{70}$, $C_{74}$, $C_{76}$, $C_{78}$, $C_{82}$, $C_{84}$, $C_{720}$, and $C_{860}$); a fullerene derivative, e.g., 1-(3-methoxy-carbonyl)propyl-1-phenyl(6,6)$C_{61}$ (PCBM), $C_{71}$-PCBM, $C_{84}$-PCBM, and/or bis-PCBM; an inorganic semiconductor, e.g., CdS, CdTe, CdSe, and/or ZnO; a derivative thereof; and a copolymer thereof, but is not limited thereto.

When two or more kinds of photoactive materials having different energy levels form a bulk heterojunction, the material having a relatively low LUMO (lowest unoccupied molecular orbital) level may be used for an electron acceptor, and the material having a relatively high LUMO level may be used for an electron donor.

For example, the electron acceptor may be fullerene ($C_{60}$, $C_{70}$, $C_{74}$, $C_{76}$, $C_{78}$, $C_{82}$, $C_{84}$, $C_{720}$, and $C_{860}$), and/or a fullerene derivative, e.g., 1-(3-methoxy-carbonyl)propyl-1-phenyl(6,6)$C_{61}$ (PCBM), $C_{71}$-PCBM, $C_{84}$-PCBM, and/or bis-PCBM.

For example, the electron donor may be a polymer having a relatively high highest occupied molecular orbital (HOMO) level, for example, a polymer having a HOMO level of about 5.4 eV to about 6.0 eV or a polymer having a HOMO level of about 5.5 to 6.0 eV. By using the polymer having the relatively high HOMO level as an electron donor, the open circuit voltage may be increased to improve the efficiency of the solar cell.

Such a polymer may include, for example, a carbazole-based compound, a fluorene-based compound, a halogenated fused thiophene, and/or a (dithieno[3,2-b:2'3'-d]silole)-based compound, but is not limited thereto.

The partially oxidized metal thin film 40 may be disposed between the first electrode 10 and the photoactive layer 30 to play a role of an interlayer, so as to increase charge mobility between the photoactive layer 30 and the first electrode 10. The drawing shows only the case that the partially oxidized metal thin film 40 is disposed between the first electrode 10 and the photoactive layer 30, but is not limited thereto. The partially oxidized metal thin film 40 may be disposed both between the first electrode 10 and photoactive layer 30 and between the second electrode 20 and the photoactive layer 30.

In example embodiments, the partially oxidized metal thin film 40 includes a metal portion and a metal oxide portion together in the thin film differing from the fully oxidized metal thin film. The partially oxidized metal thin film 40 may have a work function between that of the non-oxidized metal and the fully oxidized metal.

The fully oxidized metal may have a higher work function than the non-oxidized metal and may increase the work function by oxidizing the non-oxidized metal. Accordingly, the partially oxidized metal thin film 40 may have a required work function by adjusting the oxidizing degree of the metal.

The partially oxidized metal thin film 40 may be controlled to have a work function between that of the first electrode 10 and the energy level of an electron donor or electron acceptor for the photoactive layer 30.

When the first electrode 10 is an anode, the partially oxidized metal thin film 40 may be controlled to have a work function between that of the first electrode 10 and the HOMO level of the electron donor for the photoactive layer 30.

In example embodiments, the work function of the partially oxidized metal thin film 40 may have a difference in a predetermined or given range from the work function of the first electrode 10 and the HOMO level of the electron donor. For example, the work function difference between the partially oxidized metal thin film 40 and the first electrode 10 may range from about 0.2 eV to about 0.95 eV, and the difference of between the work function of the partially oxidized metal thin film 40 and the HOMO level of the electron donor may range from about 0.05 eV to about 1.0 eV. The work function difference between the partially oxidized metal thin film 40 and the lower electrode 10 may range from about 0.4 eV to about 0.8 eV, and the difference between the work function of the partially oxidized metal thin film 40 and the HOMO level of electron donor may range from about 0.1 eV to about 0.75 eV.

By having the energy level difference within the range, when holes generated from the photoactive layer 30 are passed through the partially oxidized metal thin film 40 and moved to the first electrode 10, the energy barrier may be lowered to increase the charge mobility. In addition, by having the energy level difference within the range, electrons generated in the photoactive layer 30 may be prevented or inhibited from moving to the anode through the partially oxidized metal thin film 40, so the hole loss due to recombination may be prevented or inhibited. Thereby, the efficiency of solar cell may be enhanced.

Particularly, when the electron donor is a polymer having a relatively high HOMO level as in the above, the work function of the interlayer is also required to be controlled to provide the energy level difference. For example, when the electron donor is a polymer having a HOMO level of about 5.4 eV to about 6.0 eV, the partially oxidized metal thin film 40 may be controlled to have a work function of about 5.2 eV to 5.8 eV. Within the range, the partially oxidized metal thin film 40 may be controlled to have a work function of about 5.4 eV to 5.6 eV.

Thereby, the work function of the interlayer may be more easily controlled according to the energy level of the electron donor even when using an electron donor having a relatively high HOMO level. Accordingly, the efficiency of the solar cell is ultimately enhanced by increasing the charge mobility by the interlayer as well as by increasing the open circuit voltage by the electron donor having a relatively high HOMO level.

The first electrode 10 may be an anode as described above, but the first electrode 10 may also be a cathode in the same manner. In example embodiments, the LUMO level of the electron acceptor may be described instead of the HOMO level of the electron donor for the photoactive layer 30.

When the first electrode 10 is an anode, the metal may be nickel (Ni), ruthenium (Ru), tungsten (W), molybdenum (Mo), vanadium (V), iridium (Ir), niobium (Nb), tantalum (Ta), Rhodium (Rh) or a combination thereof, but is not limited thereto. When the first electrode 10 is a cathode, the metal may include titanium (Ti), zinc (Zn), silicon (Si), or a combination thereof, but is not limited thereto.

The partially oxidized metal thin film 40 may have a thickness of less than or equal to about 10 nm. For example, the thickness may range from about 3 nm to about 10 nm. By providing the thickness within the range, the interlayer having a required work function may be provided while not deteriorating the transmittance.

Hereinafter, a method of manufacturing the solar cell is illustrated referring to FIG. 1. A method of manufacturing a solar cell according to example embodiments may include forming a first electrode 10, forming a metal thin film (not shown) on the first electrode 10, oxidizing the metal thin film partially to provide a partially oxidized metal thin film 40, forming a photoactive layer 30 including an electron donor and an electron acceptor on the partially oxidized metal thin film 40, and forming a second electrode 20 on the photoactive layer 30.

The first electrode 10 may be made of, for example, a transparent conductor, e.g., indium tin oxide (ITO), indium doped zinc oxide (IZO), tin oxide ($SnO_2$), aluminum doped zinc oxide (AZO), and/or gallium doped zinc oxide (GZO), and the other may be made of an opaque conductor, e.g., aluminum (Al), silver (Ag), gold (Au), and lithium (Li). The first electrode 10 may be made, for example, using sputtering or deposition, and may be a single layer or multiple layers.

The metal thin film may be provided by using a method, e.g., sputtering or deposition of, for example, nickel (Ni), ruthenium (Ru), tungsten (W), molybdenum (Mo), vanadium (V), iridium (Ir), niobium (Nb), tantalum (Ta), Rhodium (Rh), titanium (Ti), zinc (Zn), silicon (Si), or a combination thereof.

The oxidizing of the metal thin film may be partially performed by placing the metal thin film in a chamber of a vacuum atmosphere of less than or equal to about $10^{-3}$ Torr, and annealing the resultant by providing an oxygen-containing gas. Herein, the annealing may be performed at a temperature of about 200 to 600° C., and the oxygen-containing gas may be oxygen gas ($O_2$), ozone gas ($O_3$), or a mixed gas thereof, at a flow rate of about 10 to about 200 sccm for about 1 minute to about 30 minutes. The annealing may be stopped before fully oxidizing the metal thin film.

Forming the photoactive layer 30 may include coating a mixed solution of an electron donor polymer and an electron acceptor polymer by a solution process, for example, spin coating, or inkjet printing, and drying the same.

The second electrode 20 may be made of a transparent conductor, e.g., indium tin oxide (ITO), indium doped zinc oxide (IZO), tin oxide ($SnO_2$), aluminum doped zinc oxide (AZO), and/or gallium doped zinc oxide (GZO), and the other may be made of an opaque conductor, e.g., aluminum (Al), silver (Ag), gold (Au), and/or lithium (Li). The second electrode 20 may be made, for example, using sputtering or deposition, and may be a single layer or multiple layers.

Hereinafter, this disclosure is illustrated in more detail with reference to examples and comparative examples. However, they are example embodiments, and this disclosure is not limited thereto.

Confirmation of Work Function Change Depending Upon Annealing Condition

Experimental Example 1

A 9 nm-thick molybdenum thin film is formed on an ITO substrate according to a sputtering method. The ITO substrate is put into a vacuum chamber and supplied with oxygen gas ($O_2$) at a flow rate of 50 sccm at 350° C. to provide a partially oxidized molybdenum thin film. A change in the work function of the partially oxidized molybdenum thin film is monitored depending upon the annealing time.

Experimental Example 2

A 9 nm-thick molybdenum (Mo)/titanium (Ti) thin film is formed on an ITO substrate according to a sputtering method. The ITO substrate is put into a vacuum chamber and supplied with oxygen gas ($O_2$) at a flow rate of 50 sccm for 5 minutes to provide a partially oxidized molybdenum thin film. A change in the work function of the partially oxidized molybdenum thin film is monitored depending upon the annealing temperature at 100° C., 200° C., 300° C., 400° C., and 500° C.

Evaluation 1

Figure 2:
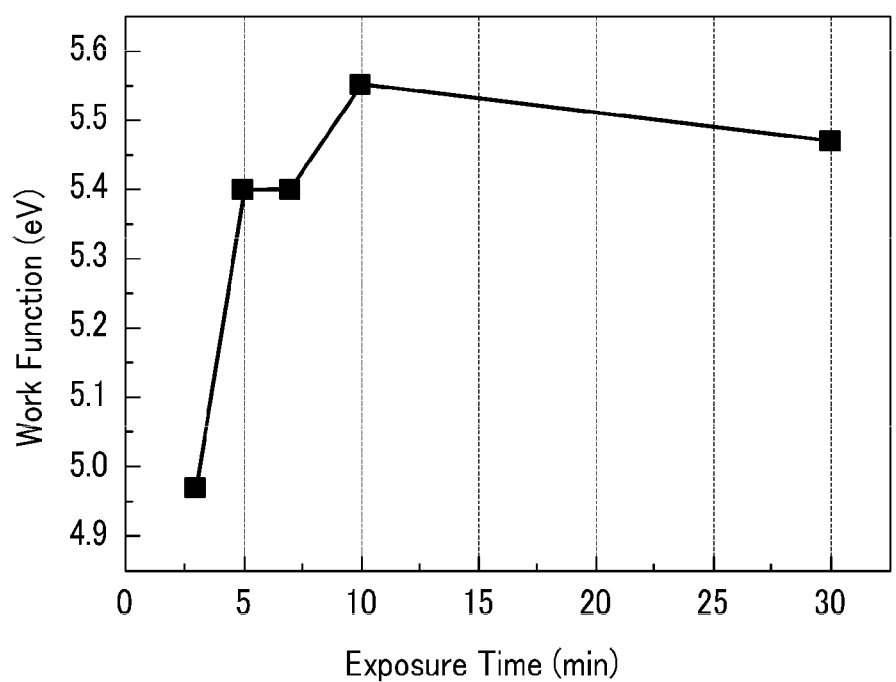
FIG. 2 is a graph showing a work function change of a partially oxidized molybdenum thin film obtained from Experimental Example 1 depending upon annealing time.
Figure 3:
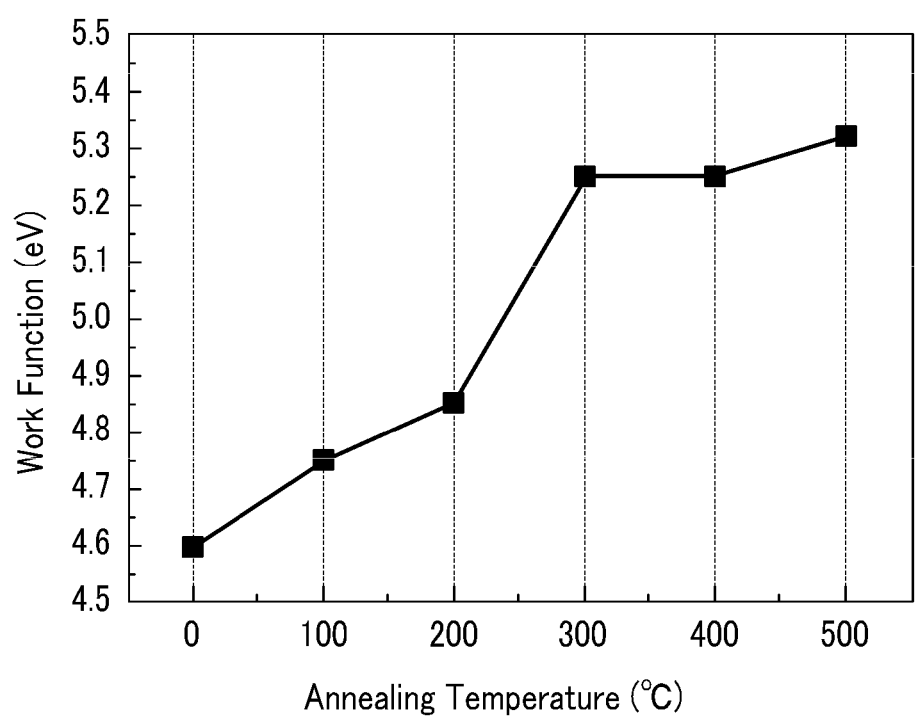
FIG. 3 is a graph showing a work function change of a partially oxidized molybdenum thin film obtained from Experimental Example 2 depending upon annealing temperature.

FIG. 2 is a graph showing the work function change of the partially oxidized molybdenum thin film obtained from Experimental Example 1 depending upon annealing time, and FIG. 3 is a graph showing the work function change of the partially oxidized molybdenum thin film obtained from Experimental Example 2 depending upon annealing temperature.

Referring to FIG. 2, the work function is gradually increased for about 10 minutes after starting the annealing, and the work function is little changed or slightly decreased after about 10 minutes. From the results, it is understood that when the annealing time is less than or equal to about 10 minutes under the condition of Experimental Example 1, the partially oxidized molybdenum thin film is formed to control the work function, and when the annealing time is more than about 10 minutes, the molybdenum thin film is fully oxidized to provide an almost steady work function.

Referring to FIG. 3, the work function is gradually increased according to increasing the annealing temperature. From the results, it is understood that the partially oxidized metal thin film having a predetermined or given work function may be provided by controlling the annealing temperature.

Fabrication of Solar Cell

Example 1

A 150 nm-thick ITO anode is formed on a transparent glass substrate having a thickness of 1 mm according to a sputtering method. A 9 nm-thick molybdenum thin film is formed on the ITO anode according to a sputtering method. The substrate is put into a vacuum chamber and supplied with oxygen gas ($O_2$) in a flow rate of 50 sccm at 350° C. for 7 minutes to provide a partially oxidized molybdenum thin film (work function: 5.4 eV). Then 7 mg of an electron donor (Mw=59.9 kg/mol, HOMO level: 5.5 eV) represented by the following Chemical Formula A and 28 mg of C71-PCBM are dissolved in chlorobenzene to provide a mixture which is then coated on the partially oxidized molybdenum thin film according to a spin coating method to provide a photoactive layer. An 80 nm-thick aluminum (Al) cathode is formed on the photoactive layer to provide a solar cell.

[Chemical Formula A]

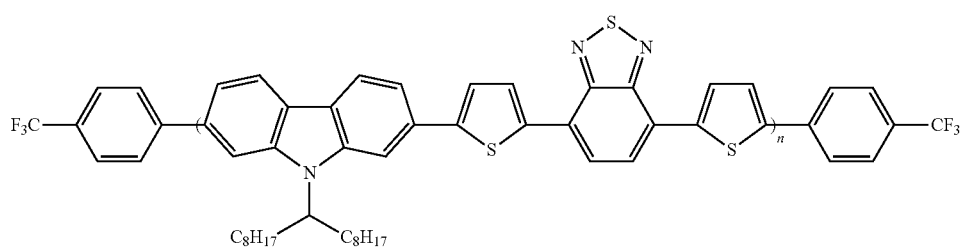

Example 2

A solar cell is fabricated in accordance with the same procedure as in Example 1, except that an electron donor (Mw=15.7 kg/mol) represented by the following Chemical Formula B is used instead of the electron donor represented by Chemical Formula A.

[Chemical Formula B]

Example 3

A solar cell is fabricated in accordance with the same procedure as in Example 1, except that an electron donor (Mw=386 kg/mol) represented by the following Chemical Formula C is used instead of the electron donor represented by Chemical Formula A.

[Chemical Formula C]

Comparative Example 1

A solar cell is fabricated in accordance with the same procedure as in Example 1, except that the partially oxidized molybdenum thin film is not provided.

Comparative Example 2

A solar cell is fabricated in accordance with the same procedure as in Example 2, except that the partially oxidized molybdenum thin film is not provided.

Comparative Example 3

A solar cell is fabricated in accordance with the same procedure as in Example 3, except that the partially oxidized molybdenum thin film is not provided.

Evaluation 2

The physical properties of solar cells obtained from Examples 1 to 3 and Comparative Examples 1 to 3 are evaluated. First, the solar cells obtained from Examples 1 to 3 and Comparative Examples 1 to 3 are measured for photocurrent voltage, and open-circuit voltage (Voc), short-circuit current (Jsc), and fill factor (FF) are calculated from the measured photocurrent curved line. From the results, the efficiency of the solar cell is evaluated.

As a light source, a xenon lamp (Oriel, 01193) is used, and the solar condition of the xenon lamp (AM 1.5) is compensated by using a standard solar cell (Fraunhofer Institute for Solar Energy Systems, Certificate No. C-ISE369, Type of material: Mono-Si+KG filter).

The results are shown in Table 1.

TABLE 1

| | Voc (mV) | Jsc (mA/cm$^2$) | FF (%) | Efficiency (%) |
|---|---|---|---|---|
| Example 1 | 0.92 | 9.33 | 59.6 | 5.12 |
| Comparative Example 1 | 0.90 | 9.82 | 52.9 | 4.68 |
| Example 2 | 0.83 | 2.39 | 57.1 | 1.135 |
| Comparative Example 2 | 0.77 | 2.71 | 44.1 | 0.92 |
| Example 3 | 0.92 | 1.56 | 67.5 | 0.97 |
| Comparative Example 3 | 0.62 | 2.05 | 50.4 | 0.70 |

Referring to Table 1, solar cells obtained from Examples 1, 2, and 3 have higher current density and higher efficiency than solar cells obtained from Comparative Examples 1, 2, and 3, respectively.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A solar cell comprising:
    a first electrode;
    a second electrode facing the first electrode;
    a photoactive layer between the first electrode and the second electrode, the photoactive layer including an electron donor and an electron acceptor; and
    a partially oxidized metal thin film between the first electrode and the photoactive,
    wherein the difference between a work function of the partially oxidized metal thin film and a work function of the first electrode ranges from about 0.2 eV to about 0.95 eV, and
    wherein the difference between a work function of the partially oxidized metal thin film and a highest occupied molecular orbital (HOMO) level of the electron donor ranges from about 0.05 eV to about 1.0 eV.

2. The solar cell of claim 1, wherein the partially oxidized metal thin film has a work function between that of a non-oxidized metal and that of a fully oxidized metal.

3. The solar cell of claim 1, wherein the electron donor has a HOMO level of about 5.4 eV to about 6.0 eV.

4. The solar cell of claim 1, wherein
    the difference between a work function of the partially oxidized metal thin film and a work function of the first electrode ranges from about 0.4 eV to about 0.8 eV, and
    the difference between a work function of the partially oxidized metal thin film and a HOMO level of the electron donor ranges from about 0.1 eV to about 0.75 eV.

5. The solar cell of claim 4, wherein the electron donor has a HOMO level of about 5.4 eV to about 6.0 eV.

6. The solar cell of claim 1, wherein the partially oxidized metal of the partially oxidized metal thin film has a work function of about 5.2 eV to about 5.8 eV.

7. The solar cell of claim 1, wherein the partially oxidized metal of the partially oxidized metal thin film has a work function of about 5.4 eV to about 5.6 eV.

8. The solar cell of claim 1, wherein the first electrode is an anode, and the metal of the partially oxidized metal thin film includes one of nickel (Ni), ruthenium (Ru), tungsten (W), molybdenum (Mo), vanadium (V), iridium (Ir), niobium (Nb), tantalum (Ta), Rhodium (Rh) and a combination thereof.

9. The solar cell of claim 1, wherein the first electrode is a cathode, and the metal of the partially oxidized metal thin film includes one of titanium (Ti), zinc (Zn), silicon (Si) and a combination thereof.

10. The solar cell of claim 1, wherein the partially oxidized metal thin film has a thickness of less than or equal to about 10 nm.

11. A method of manufacturing a solar cell, the method comprising:
    forming a first electrode;
    forming a metal thin film on a first electrode;
    partially oxidizing the metal thin film to form a partially oxidized metal thin film;
    forming a photoactive layer on the partially oxidized thin film, the photoactive layer including an electron donor and an electron acceptor; and
    forming a second electrode on the photoactive layer,
    wherein the difference between a work function of the partially oxidized metal thin film and a work function of the first electrode ranges from about 0.2 eV to about 0.95 eV, and
    wherein the difference between a work function of the partially oxidized metal thin film and a highest occupied molecular orbital (HOMO) level of the electron donor ranges from about 0.05 eV to about 1.0 eV.

12. The method of claim 11, wherein the partially oxidizing the metal thin film anneals the metal thin film at a temperature of about 200° C. to about 600° C. while supplying an oxygen-containing gas.

13. The method of claim 12, wherein the partially oxidizing the metal thin film anneals the metal thin film by providing at least one of oxygen gas ($O_2$) and ozone gas ($O_3$) at a flow rate of about 10 sccm to about 200 sccm for about 1 minute to about 30 minutes.

14. The method of claim 11, wherein the partially oxidizing the metal thin film forms the partially oxidized metal thin film having a work function between that of a non-oxidized metal and that of a fully oxidized metal.

15. The method of claim 11, wherein the partially oxidizing the metal thin film forms the partially oxidized metal thin film having a work function of about 5.2 eV to about 5.8 eV.

16. The method of claim 11, wherein the forming a photoactive layer forms the electron donor having a HOMO level with a work function of about 5.4 eV to about 6.0 eV.

* * * * *